(12) United States Patent
Roosli et al.

(10) Patent No.: US 8,772,982 B2
(45) Date of Patent: Jul. 8, 2014

(54) MULTI-GANG CAPACITIVE TOUCH SWITCH PLATE

(75) Inventors: Philipp Roosli, Niantic, CT (US); Ryan Gardner, Niantic, CT (US); Rick Quirino, East Lyme, CT (US)

(73) Assignee: Inncom International Inc., Niantic, CT (US)

( * ) Notice: Subject to any disclaimer, the term of this patent is extended or adjusted under 35 U.S.C. 154(b) by 870 days.

(21) Appl. No.: 12/413,039

(22) Filed: Mar. 27, 2009

(65) Prior Publication Data
US 2010/0244586 A1    Sep. 30, 2010

(51) Int. Cl.
*H01H 83/00* (2006.01)

(52) U.S. Cl.
USPC ........... 307/116; 307/125; 361/631; 361/632; 345/173; 345/174; 345/156

(58) Field of Classification Search
USPC .......................... 307/125, 116; 361/631, 632; 345/173–174, 156
See application file for complete search history.

(56) References Cited

U.S. PATENT DOCUMENTS

| | | | | |
|---|---|---|---|---|
| 4,766,368 A | * | 8/1988 | Cox | 324/688 |
| 6,002,996 A | * | 12/1999 | Burks et al. | 702/188 |
| 6,608,617 B2 | * | 8/2003 | Hoffknecht et al. | 345/173 |
| 7,273,983 B1 | * | 9/2007 | Rintz | 174/66 |
| 7,531,921 B2 | * | 5/2009 | Cencur | 307/126 |
| 7,831,932 B2 | * | 11/2010 | Josephsoon et al. | 715/863 |
| 2005/0126897 A1 | * | 6/2005 | Stephens | 200/5 A |
| 2007/0046639 A1 | * | 3/2007 | Swedin | 345/173 |
| 2008/0001649 A1 | | 1/2008 | Cencur | |
| 2009/0189875 A1 | * | 7/2009 | Ma | 345/174 |

* cited by examiner

*Primary Examiner* — Jared Fureman
*Assistant Examiner* — Alfonso Perez Borroto
(74) *Attorney, Agent, or Firm* — Seager, Tufte, Wickhem LLC

(57) ABSTRACT

An apparatus is provided and includes two or more sensor assemblies, each including a sensing unit at a front face thereof, and each being communicatively interconnected and power sharing, a cover plate, mounted adjacent to the front face of the sensor assemblies to entirely cover the sensing units, through which user commands are transmittable, and a wall box, onto which the sensor assemblies and the cover plate are mountable, including a housing in which a space is defined for housing of one or more devices, each device being controllable by the sensor assemblies in accordance with the user commands, and each device being disposed to fit within the space and to be in signal communication with at least one of the sensor assemblies.

18 Claims, 2 Drawing Sheets

MULTI-GANG CAPACITIVE TOUCH SWITCH PLATE

BACKGROUND OF THE INVENTION

The subject matter disclosed herein relates to multi-gang capacitive touch switch plates.

Currently, electrical wall apparatuses are being installed as individual products into a wall box and connected to their respective line voltage wires. Wall boxes are available in single, double, triple and quadruple configurations. Larger configurations are achievable but not commonly used. To provide the end assembly a finished look, a cover plate is generally applied that acts as a frame for all the installed apparatuses. The cover plate also effectively covers rough edges where sheet rock and the wall box meet.

In many instances, the Decora-style is widely used for electrical wall apparatuses. This style provides for the ability to visually integrate products in an apparatus from different manufacturers, such as a light dimmer by a first manufacturer, a light switch by a second manufacturer and a door bell product by a third manufacturer.

The use of plastic cover plates is low in cost due to the low-cost, high volume manufacturing of the plastic cover plates. The disadvantages of the cover plates, however, are that products in the frame can be installed with crooked angles, that gaps may be formed between the cover plate and the apparatus and, due to the multi-vendor situation, there may be color variations between the cover plate and the apparatuses. While technically not a problem, all the mentioned disadvantages yield a somewhat lessened esthetic outcome.

To improve this situation, highly esthetic, customizable control surfaces based on glass utilizing capacitive touch technology have been introduced. To create a single gang box device, the approach includes combining a glass surface and a capacitive touch sensor behind the glass with an optional actuating control device mounted within the wall cavity. To provide flexibility to create customized control surfaces, the products may come in different sensor and LED indicator configurations, such as a number of discrete touch points, a single slider, a double slider, a slider combined with a few discrete touch points, etc. For a double gang box or any larger box, the glass surface would be expanded and the sensor circuit board would be increased in size accordingly. However, once this concept is expanded to multi-gang situations, the problem of customization and adaptability becomes more difficult. That is, if there are 25 different single-gang control surfaces available, then a double gang box would contain 625 combinations, a triple gang box 15,625 and a four gang box would contain nearly 400,000 combinations. It would not be practical to create all desired combinations as the warehousing of spare parts creates huge costs and the cost for creating low-volume production runs of a particular flavor would be prohibitively expensive.

A modular system that overcomes these problems and combines the advantages of a Decora-like system with the ability to customize the user-facing surface of a single glass plate is, therefore, desirable.

BRIEF DESCRIPTION OF THE INVENTION

According to one aspect of the invention, an apparatus is provided and includes two or more sensor assemblies, each including a sensing unit at a front face thereof, and each being communicatively interconnected and power sharing, a cover plate, mounted adjacent to the front face of the sensor assemblies to entirely cover the sensing units, through which user commands are transmittable, and a wall box, onto which the sensor assemblies and the cover plate are mountable, including a housing in which a space is defined for housing of one or more devices, each device being controllable by the sensor assemblies in accordance with the user commands, and each device being disposed to fit within the space and to be in signal communication with at least one of the sensor assemblies.

According to another aspect of the invention, an apparatus is provided and includes two or more communicatively interconnected and power sharing sensor assemblies, a cover plate, mounted adjacent to the sensor assemblies to entirely cover the sensor assemblies, through which user commands are transmittable, and a wall box, onto which the sensor assemblies and the cover plate are mountable, to house one or more devices, each device being controllable by the sensor assemblies in accordance with the user commands, and each device being disposed to fit within the wall box and to be in signal communication with at least one of the sensor assemblies.

According to yet another aspect of the invention, a multi-gang electrical wall box to which two or more communicatively interconnected and power sharing sensor assemblies and a cover plate entirely covering the sensor assemblies through which user commands are transmittable are mountable is provided and includes a housing in which a housing space is defined, one or more devices, disposed to fit within the housing space, each of which is configured to control an electrical load in accordance with the user commands, and a communication system to enable signal communication between at least one of the two or more sensor assemblies of the cover plate assembly and the one or more devices.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
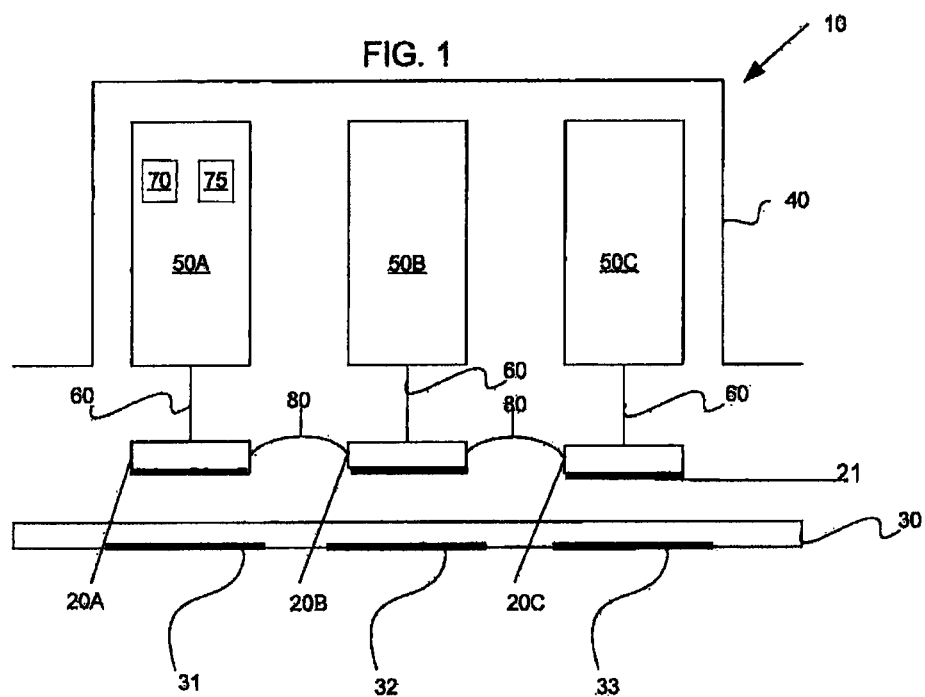
FIG. 1 is a schematic view of an apparatus including a multi-gang electrical wall box in accordance with embodiments of the invention.

With reference to FIG. 1, an apparatus 10 is provided and includes two or more sensor assemblies 20A, 20B and 20C, each of which includes a sensing unit 21 at a front face thereof, which are communicatively interconnected and power sharing, a cover plate 30, mounted adjacent to the front face of the sensor assemblies 20A, 20B and 20C to entirely cover the sensing units 21, through which user commands are transmittable to the sensing units 21, and a wall box 40, such as a multi-gang electrical wall box, onto which the sensor assemblies 20A, 20B and 20C and the cover plate 30 are mountable. The wall box 40 includes a housing in which a housing space is defined. The housing space is configured to house one or more devices 50A, 50B and 50C. Each of the devices 50A, 50B and 50C is controllable by the sensor assemblies 20A, 20B and 20C in accordance with the user commands, and each of the devices 50A, 50B and 50C is disposed to fit within the housing space and to be in signal communication with at least one of the two or more sensor assemblies 20A, 20B and 20C.

As such, the apparatus 10 provides for a multi-gang application with modular elements that allow for a finished application to have made use of prefabricated components that can be easily assembled by, e.g., an end-user. Such a solution would include the cover plate 30 as being, for example, a single component made of customized glass or some other similar material that is, typically, silkscreened to match the particular esthetic requirements of a customer.

The artwork of the cover plate 30 would be structured into sections 31, 32 and 33 that can be provided on a front face or a rear face of the cover plate 30 to mimic the ganging of the devices 50A, 50B and 50C. Each section 31-33 would be formed to encompass a profile of a sensor and to include an image of a user interface that corresponds to the control of a device. For example, section 31 of FIG. 1 could contain images of five discrete buttons that can be interfaced with by a user and which are each sensed by sensor 20A for control of device 50A. Similarly, section 32 could contain images of two linear sliders that can be interfaced with by the user and which are each sensed by sensor 20B for control of device 50B. Finally, section 33 could contain an image of a wheel sensor that can be interfaced with by the user and which is sensed by sensor 20C for control of device 50C.

In a case in which a customer desires that the sliders and the wheel change position, corresponding artwork for the glass can be created off-site. On-site, the sensor assemblies B and C would merely need to be swapped with one another while the arrangement of the devices 50A-C will not need to be modified.

The sensors 20A-C may include various types of sensors. In particular, at least one of the sensors 20A-C may include a capacitive touch sensor. In this case, a user interfacing with the cover plate 30 will be able to affect a sensor response without actually contacting sensor components. In this way, the cover plate 30 can entirely cover the sensing units 21 of the sensor assemblies 20A, 20B and 20C and still allow for the user commands to be transmitted to the sensing units 21.

The devices 50A-C may be configured to control an electrical load in accordance with control signals issued by the sensors 20A-C, which are based on the user inputs and commands to the sensors 20A-C via the cover plate 30. To that end, the devices 50A-C may be actuating applications that are mounted into the multi-gang electrical wall box 40 and can include dimmers, relays, sound-producing devices (such as a door bell) and/or other similar devices. The devices 50A-C may further jointly or separately contain a power source 70 that can provide power to the sensors 20A-C.

It is to be understood that it is not necessary for there to be a device behind every sensor. In such a case, a sensor without a device behind it may be used to control a device remotely or in an alternate embodiment to provide additional control of a device that is controlled by another sensor.

The sensors 20A-C and the devices 50A-C are interconnected. That is, each of the sensors 20A-C may contain a link 60 to its corresponding device. Each particular link 60 allows a sensor to control its linked device. In addition, in a case in which one of the devices, say device 50A, is linked to sensor 20A and contains power source 70, the link 60 is also used to route power to sensor 20A.

The sensors 20A-C are interconnected with a bus 80. The bus 80 is used for communication and power distribution between the sensors 20A-C. For example, if device 50B does not contain a power supply, then sensor 20B would be powered from either device 50A and/or device 50C. Also, communications over the bus 80 allow the sensors 20A-C to operate in a system-style configuration. For example, should device 50A contain a wireless transponder 75, such as one that is based on the ZigBee protocol standard or some other suitable protocol, devices 50B and 50C could utilize this transponder via proxy services offered by device 50A. Further, sensor 20B could operate its directly associated device, the other devices in the multi-gang electrical wall box 40, and, through wired and wireless components, remotely distributed devices. Such distributed devices could be other wall box mounted devices, load center style dimmers and relay assemblies, or audio and video (A/V) equipment.

Figure 2:
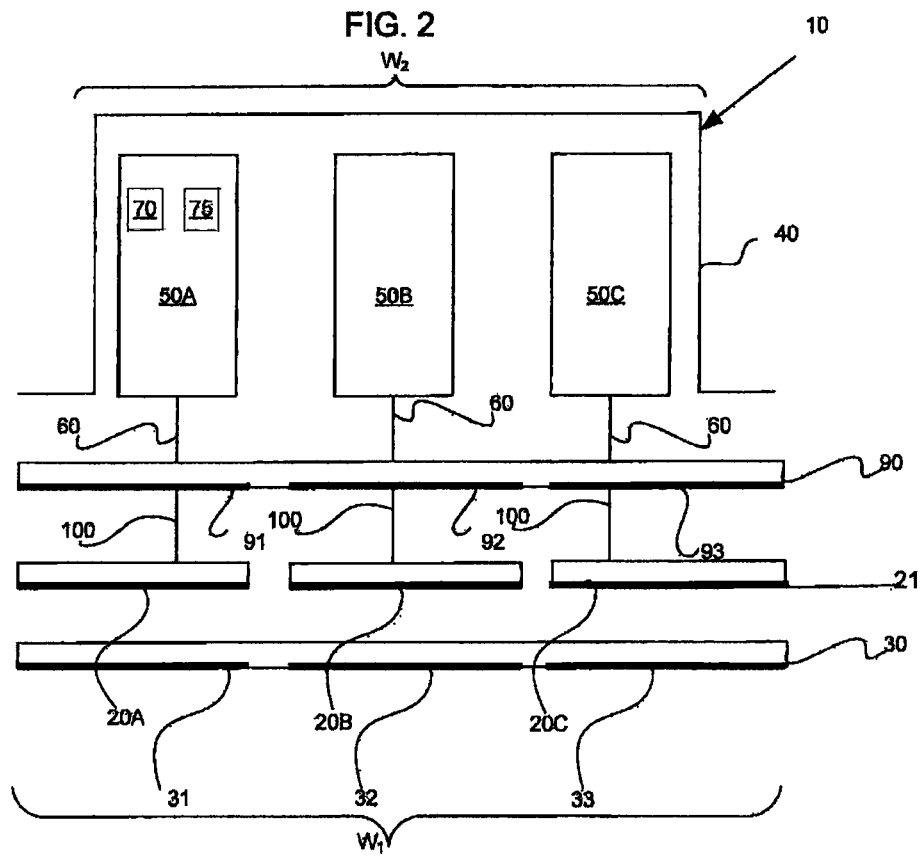
FIG. 2 is a schematic view of an apparatus including a multi-gang electrical wall box in accordance with embodiments of the invention.

With reference to FIG. 2 and, in accordance with another aspect of the invention, an apparatus 10 is provided which is generally similar to that of FIG. 1, except for the inclusion of a printed circuit board (PCB) 90, which may include sensor headings 91, 92 and 93, to interconnect the sensors 20A-C with one another and by which the sensors 20A-C share power and communicate.

The PCB 90 acts as a bus to interconnect the sensors 20A-C and to provide the connectivity to the devices 50A-C installed into the multi-gang electrical wall box 40. This arrangement allows the sensors 20A-C to be wider than the regular pitch of a multi-gang wall box and allows the sensors 20A-C to make use of the significant space that is newly available. In this case, the width $w_1$ of the sensors 20A-C can be made to be wider than the maximum width $w_2$ of a particular multi-gang electrical wall box 40 that is being targeted for production without negatively impacting the user friendliness of the product. Instead of being limited by the gang pitch of the wall box, formerly unused areas of the left and right border become now available to be used for the capacitive touch surfaces and the buttons, sliders and wheels will be much easier to operate. This effect can be further increased by making the cover plate 30 wider than a regular gang box cover plate as the width of the cover plate would not be required to adhere to the pitch standard of the wall box.

Figure 3:
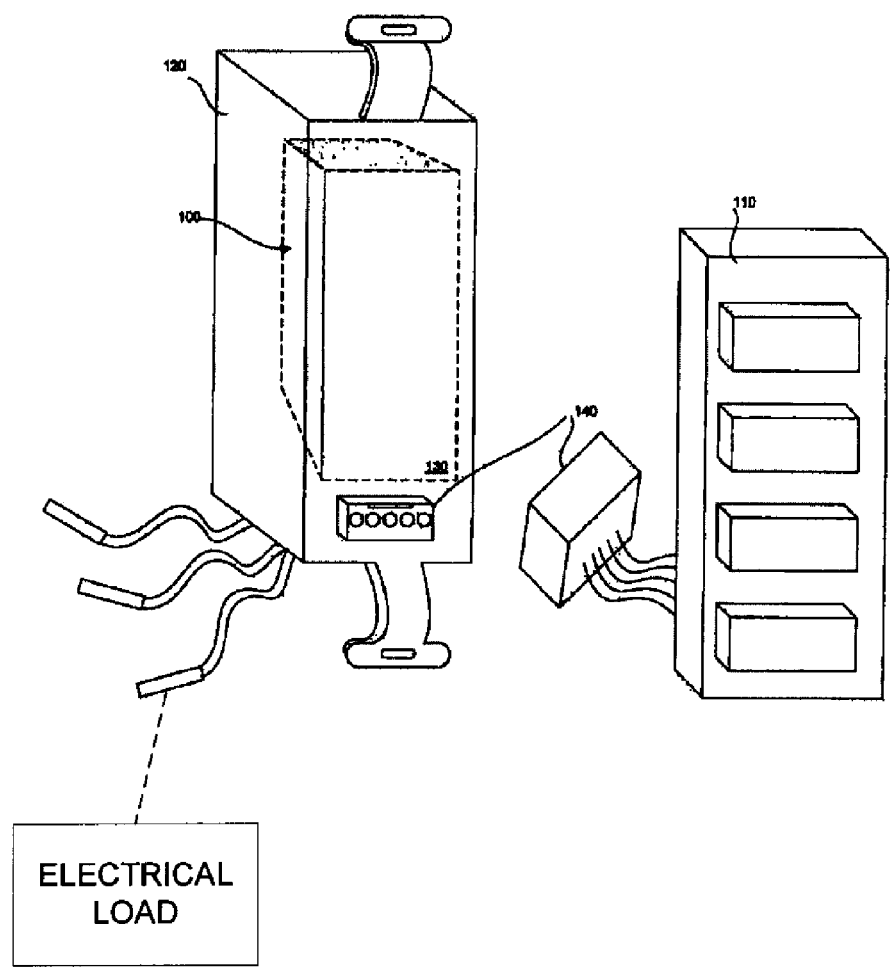
FIG. 3 is a schematic view of a multi-gang electrical wall box in accordance with embodiments of the invention.

With reference to FIG. 3 and, in accordance with another aspect of the invention, a multi-gang electrical wall box 100 to which a cover plate assembly 110, including a cover plate and multiple interconnected sensors, is mountable, is provided. As shown, the multi-gang electrical wall box 100 includes a housing 120, in which a housing space is defined, one or more devices 130, disposed to fit within the housing space, each of which is configured to control an electrical load in accordance with the user commands, and a communication system 140 to enable signal communication between at least one of the two or more sensor assemblies of the cover plate assembly 110 and the one or more devices 130.

In accordance with embodiments of the invention, the communication system 140 enables the signal communication via wired components, as is shown in FIG. 3. However, this is merely exemplary and it is to be understood that the signal communication may be enabled via wireless components, such as transponders, antennae and/or other similar communication devices.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An apparatus, comprising:
   two or more sensor assemblies each including a sensing unit at a front face thereof, the two or more sensor assemblies communicatively interconnected to one another via a communication bus;
   a cover plate, mounted adjacent to the front face of the sensor assemblies to entirely cover the sensing units, through which user commands are transmittable; and
   a wall box, onto which the sensor assemblies and the cover plate are mountable, the wall box including a housing in which a space is defined for housing two or more control devices, each of the two or more control devices being disposed to fit within the space, each of the two or more control devices receiving inputs from at least one of the sensor assemblies in accordance with the user commands, and wherein at least one of the two or more control devices comprises a load control device that is configured to control an external electrical load located external to the wall box.

2. The apparatus according to claim 1, wherein at least one of the sensor assemblies comprises a capacitive touch sensor.

3. The apparatus according to claim 1, further comprising a power source to provide power to at least one of the sensor assemblies.

4. The apparatus according to claim 1, wherein the communication bus comprises wiring disposed between the sensor assemblies.

5. The apparatus according to claim 1, further comprising a printed circuit board, wherein the printed circuit board supports at least part of the communication bus.

6. The apparatus according to claim 5, wherein at least one of the sensor assemblies comprises a capacitive touch sensor.

7. The apparatus according to claim 5, further comprising a power source to provide power to at least one of the sensor assemblies.

8. The apparatus according to claim 5, wherein the printed circuit board comprises a sensor heading for each sensor assembly.

9. The apparatus according to claim 5, wherein the sensor assemblies have a first width and the wall box has a second width different from the first width.

10. The apparatus according to claim 5, wherein the sensor assemblies have a width that is wider than that of the wall box.

11. An apparatus, comprising:
    two or more sensor assemblies communicatively interconnected via a communication bus;
    a cover plate, mounted adjacent to the sensor assemblies to entirely cover the sensor assemblies, through which user commands are transmittable; and
    a wall box, onto which the sensor assemblies and the cover plate are mountable, the wall box configured to house two or more control devices, wherein each of the two or more control devices receive input from at least one of the sensor assemblies in accordance with the user commands, and wherein at least one of the two or more control devices comprises a load control device that is configured to control an external electrical load located external to the wall box.

12. The apparatus according to claim 11, further comprising a printed circuit board, wherein the printed circuit board supports at least part of the communication bus.

13. A multi-gang electrical wall box to which two or more communicatively interconnected and power sharing sensor assemblies and a cover plate entirely covering the sensor assemblies through which user commands are transmittable are mountable, the multi-gang electrical wall box comprising:
    a housing in which a housing space is defined;
    two or more devices, each of the two or more devices being disposed to fit within the housing space, and at least one of the two or more devices being configured to control an electrical load external to the wall box; and
    a communication system to enable signal communication between the two or more sensor assemblies and at least one of the two or more devices.

14. The multi-gang electrical wall box according to claim 13, wherein the communication system enables the signal communication via wired components.

15. The multi-gang electrical wall box according to claim 13, wherein the communication system enables the signal communication via wireless components.

16. The apparatus according to claim 1, wherein the two or more sensor assemblies are disposed in one of multiple arrangements and the cover plate is prefabricated in accordance with one of the multiple arrangements.

17. The apparatus according to claim 1, wherein at least one of the two or more control devices has power routed thereto by a corresponding one of the two or more sensor assemblies.

18. The apparatus according to claim 1, wherein the communication bus makes power available to the two or more sensor assemblies; and the two or more control devices.

* * * * *